United States Patent
Tsuchiya et al.

(10) Patent No.: US 10,121,663 B2
(45) Date of Patent: Nov. 6, 2018

(54) SEMICONDUCTOR DEVICE AND METHOD FOR PRODUCING SAME

(71) Applicant: DENSO CORPORATION, Kariya, Aichi-pref. (JP)

(72) Inventors: Yoshinori Tsuchiya, Kariya (JP); Hiroyuki Tarumi, Kariya (JP); Shinichi Hoshi, Kariya (JP); Masaki Matsui, Kariya (JP); Kenji Itoh, Nagakute (JP); Tetsuo Narita, Nagakute (JP); Tetsu Kachi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 13 days.

(21) Appl. No.: 15/320,799

(22) PCT Filed: Mar. 26, 2015

(86) PCT No.: PCT/JP2015/001761
§ 371 (c)(1),
(2) Date: Dec. 21, 2016

(87) PCT Pub. No.: WO2015/198512
PCT Pub. Date: Dec. 30, 2015

(65) Prior Publication Data
US 2017/0162391 A1    Jun. 8, 2017

(30) Foreign Application Priority Data
Jun. 26, 2014 (JP) .................. 2014-131692

(51) Int. Cl.
*H01L 21/223*    (2006.01)
*H01L 21/20*    (2006.01)
(Continued)

(52) U.S. Cl.
CPC .......... *H01L 21/2233* (2013.01); *H01L 21/20* (2013.01); *H01L 21/28264* (2013.01);
(Continued)

(58) Field of Classification Search
CPC .................................................. H01L 21/2233
(Continued)

(56) References Cited

U.S. PATENT DOCUMENTS

2004/0188693 A1 *  9/2004  Nakayama .......... H01L 21/0237
                                                                  257/94
2007/0278518 A1 * 12/2007  Chen ................. H01L 29/66462
                                                                  257/192
(Continued)

FOREIGN PATENT DOCUMENTS

EP       1873280 A1 *  1/2008  ............. C30B 23/00
JP       2006-114802 A    4/2006
(Continued)

*Primary Examiner* — Igwe U Anya
(74) *Attorney, Agent, or Firm* — Posz Law Group, PLC

(57) ABSTRACT

A semiconductor device includes a GaN device provided with: a substrate made of a semi-insulating material or a semiconductor; a channel-forming layer including a GaN layer arranged on the substrate; a gate structure in which a gate-insulating film in contact with the GaN layer is arranged on the channel-forming layer, the gate structure having a gate electrode arranged across the gate-insulating film; and a source electrode and a drain electrode that are arranged on the channel-forming layer and on opposite sides interposing the gate structure. The donor element concentration at the interface between the gate-insulating film and the GaN layer and at the lattice position on the GaN layer side with respect to the interface is set to be less than or equal to $5.0 \times 10^{17}$ cm$^{-3}$.

3 Claims, 3 Drawing Sheets

(51) Int. Cl.
| | |
|---|---|
| *H01L 29/786* | (2006.01) |
| *H01L 29/04* | (2006.01) |
| *H01L 29/10* | (2006.01) |
| *H01L 29/20* | (2006.01) |
| *H01L 29/205* | (2006.01) |
| *H01L 29/423* | (2006.01) |
| *H01L 29/66* | (2006.01) |
| *H01L 29/778* | (2006.01) |
| *H01L 21/28* | (2006.01) |
| *H01L 29/417* | (2006.01) |
| *H01L 29/51* | (2006.01) |

(52) U.S. Cl.
CPC ........ *H01L 29/045* (2013.01); *H01L 29/1041* (2013.01); *H01L 29/2003* (2013.01); *H01L 29/205* (2013.01); *H01L 29/4236* (2013.01); *H01L 29/66462* (2013.01); *H01L 29/7786* (2013.01); *H01L 29/7787* (2013.01); *H01L 29/786* (2013.01); *H01L 29/41766* (2013.01); *H01L 29/517* (2013.01)

(58) Field of Classification Search
USPC .......................................................... 257/76
See application file for complete search history.

(56) References Cited

U.S. PATENT DOCUMENTS

| | | | |
|---|---|---|---|
| 2010/0283083 A1* | 11/2010 | Niiyama | H01L 29/66606 257/192 |
| 2011/0006346 A1 | 1/2011 | Ando et al. | |
| 2013/0242618 A1 | 9/2013 | Yamada | |
| 2013/0309828 A1 | 11/2013 | Kambayashi et al. | |
| 2013/0313611 A1* | 11/2013 | Khalil | H01L 29/34 257/194 |
| 2016/0064539 A1* | 3/2016 | Lu | H01L 29/66462 257/76 |

FOREIGN PATENT DOCUMENTS

| | | | | |
|---|---|---|---|---|
| JP | 2010-098076 A | | 4/2010 | |
| JP | WO 2010044431 A1 * | | 4/2010 | ....... H01L 21/02178 |

* cited by examiner

SEMICONDUCTOR DEVICE AND METHOD FOR PRODUCING SAME

CROSS REFERENCE TO RELATED APPLICATIONS

This application is a U.S. national stage application of International Patent Application No. PCT/JP2015/001761 filed on Mar. 26, 2015 and is based on Japanese Patent Application No. 2014-131692 filed on Jun. 26, 2014, the disclosures of which are incorporated herein by reference.

TECHNICAL FIELD

The present disclosure relates to a semiconductor device having a gallium nitride (hereinafter referred to as GaN) device formed using a compound semiconductor mainly composed of GaN, and a method for producing the semiconductor device.

BACKGROUND

There has been known a semiconductor device having a GaN device formed using a compound semiconductor mainly composed of GaN. When the GaN device is to be formed, a natural oxide film is formed on the surface of a GaN layer due to exposure to the air, and hence it is necessary to remove the natural oxide film before formation of a gate insulating film. However, when the natural oxide film is removed by hydrofluoric acid, damage is left on the GaN layer.

Accordingly, Patent Literature 1 discloses a GaN device forming method capable of reducing this damaged layer. Specifically, there is performed a step of forming on a first semiconductor layer a first sacrificial layer in which solid solubility of impurities is higher than in the first semiconductor layer made up of the GaN layer. There is then performed a step of annealing the first sacrificial layer and the first semiconductor layer. Subsequently, a step of removing the first sacrificial layer by wet etching is performed, and thereafter, at least either a step of covering at least part of the first semiconductor layer with an insulator layer or a step of etching part of the semiconductor layer is performed, to remove the damage on the surface of the first semiconductor layer. Thereafter, an electrode layer electrically connected to the first semiconductor layer is formed. In such a manner, the damage formed on the surface of the GaN layer is removed.

Further, there is also a method where at the time of producing a structure with a top layer laminated on the surface of the GaN layer, the natural oxide film formed on the surface of the GaN layer is removed so as not to damage the surface. Specifically, there is performed a step of exposing the surface of the GaN layer to a gas containing ammonia in a non-plasma state. Thereafter, there is performed a step of laminating a silicon oxide ($SiO_2$) layer without exposing the surface of the GaN layer, exposed to the gas containing ammonia, to the air. In such a manner, after the natural oxide film has been removed using the gas containing ammonia, the silicon oxide film is removed on the surface of the GaN layer before formation of the natural oxide film, to thereby reduce the damage on the GaN layer.

However, even in either of the above cases, a donor element concentration (Si concentration or O concentration) in a surface layer section of the GaN layer cannot be reduced. Hence, Si or O present in the surface layer section of the GaN layer acts as a donor element to cause a variation in threshold voltage of the GaN device.

PATENT LITERATURE

Patent Literature 1: JP-2012-156269-A

SUMMARY

In view of the above points, it is an object of the present disclosure to provide a semiconductor device having a structure capable of controlling a threshold voltage to a proper value and realizing a GaN device with small variations, and a method for producing the semiconductor device.

According to a first aspect of the present disclosure, a semiconductor device includes a GaN device having: a substrate made of a semi-insulating material or a semiconductor; a channel forming layer including a GaN layer arranged on the substrate; a gate structure having a gate insulating film in contact with the GaN layer and arranged on the channel forming layer, and a gate electrode arranged via the gate insulating film; and a source electrode and a drain electrode that are arranged at opposite sides to interpose the gate structure, on the channel forming layer. A donor element concentration at an interface between the gate insulating film and the GaN layer and at a lattice position on the GaN layer side with respect to the interface is set to be equal to or less than $5.0 \times 10^{17}$ cm$^{-3}$.

As thus described, since the donor element concentration in the interface between the gate insulating film and the GaN layer and in the lattice position on the GaN layer side is set to a low concentration, a variation in threshold voltage due to the donors in the channel section can be suppressed. Hence, it is possible to control the threshold voltage to a proper value, and thereby to allow the semiconductor device to have a structure capable of realizing a GaN device with small variations.

According to a second aspect of the present disclosure, a semiconductor device includes a GaN device having: a substrate made of a semi-insulating material or a semiconductor; a channel forming layer including a GaN layer arranged on the substrate; a gate structure having a gate insulating film in contact with the GaN layer and arranged on the channel forming layer, and a gate electrode arranged via the gate insulating film; and a source electrode and a drain electrode that are arranged at opposite sides to interpose the gate structure, on the channel forming layer. A donor element concentration at an interface between the gate insulating film and the GaN layer is more than $5.0 \times 10^{17}$ cm$^{-3}$, and a donor element concentration at a lattice position on the GaN layer side with respect to the interface between the gate insulating film and the GaN layer is set to be equal to or less than $5.0 \times 10^{17}$ cm$^{-3}$.

As thus described, even when the donor element concentration in the interface between the gate insulating film and the GaN layer is more than $5.0 \times 10^{17}$ cm$^{-3}$, when the donor element concentration in the lattice position on the GaN layer side with respect to the interface between the gate insulating film and the GaN layer is set to equal to or less than $5.0 \times 10^{17}$ cm$^{-3}$, it is possible to obtain a similar effect to that of the above first aspect.

According to a third aspect of the present disclosure, a method for producing a semiconductor device including a GaN device having: a substrate made of a semi-insulating material or a semiconductor; a channel forming layer including a GaN layer arranged on the substrate; a gate structure having a gate insulating film in contact with the GaN layer and arranged on the channel forming layer, and a gate electrode arranged via the gate insulating film; and a source electrode and a drain electrode that are arranged at opposite sides to interpose the gate structure, on the channel forming layer includes: forming a channel forming layer that includes the GaN layer on the substrate; forming a gate insulating film that is in contact with the GaN layer on the channel forming layer; and removing donor elements present in a portion of the GaN layer that is in contact with the gate insulating film after the formation of the channel forming layer and before forming the gate insulating film. The gate insulating film is formed without being exposed to an atmosphere containing the donor elements after removing the donor elements As thus described, the donor elements present in the portion of the GaN layer which is in contact with the gate insulating film are removed, and after the removal of the donor elements, the gate insulating film is formed without being exposed to an atmosphere containing the donor elements. It is thereby possible to produce the semiconductor device having the structure described in the above first aspect.

According to a fourth aspect of the present disclosure, a method for producing a semiconductor device including a GaN device having: a substrate made of a semi-insulating material or a semiconductor; a channel forming layer including a GaN layer arranged on the substrate; a gate structure having a gate insulating film in contact with the GaN layer and arranged on the channel forming layer, and a gate electrode arranged via the gate insulating film; and a source electrode and a drain electrode that are arranged at opposite sides to interpose the gate structure, on the channel forming layer includes: forming a channel forming layer that includes the GaN layer on the substrate; forming a gate insulating film that is in contact with the GaN layer on the channel forming layer; and inactivating donor elements present in a portion of the GaN layer that is in contact with the gate insulating film after forming the channel forming layer and before or after forming the gate insulating film.

As thus described, after the formation of the channel forming layer, the donor elements present in the portion of the GaN layer which is in contact with the gate insulating film are inactivated before or after the formation of the gate insulating film. It is thereby possible to produce the semiconductor device having the structure described in the above second aspect.

According to a fifth aspect of the present disclosure, a method for producing a semiconductor including a GaN device provided with: a substrate made of a semi-insulating material or a semiconductor; a channel forming layer including a GaN layer arranged on the substrate; a gate structure having a gate insulating film in contact with the GaN layer and arranged on the channel forming layer, and a gate electrode arranged via the gate insulating film; and a source electrode and a drain electrode that are disposed on opposite sides to interpose the gate structure, on the channel forming layer, includes: forming a channel forming layer that includes the GaN layer on the substrate; forming a gate insulating film that is in contact with the GaN layer on the channel forming layer; and forming the GaN layer on the channel forming layer, and limiting a thermal budget to a temperature equal to or lower than a temperature at which donor elements present in a portion of the GaN device, in contact with the gate insulating film, are activated to form the GaN device.

As thus described, the semiconductor device having the structure described in the above second aspect can also be produced such that the thermal budget is limited to the temperature equal to or lower than the temperature at which the donor elements present in the portion of the GaN device, in contact with the gate insulating film, are activated to form the GaN device.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

First Embodiment

A first embodiment of the present disclosure will be described. In the present embodiment, as a semiconductor device having a GaN device formed using a compound semiconductor mainly composed of GaN, there will be described a semiconductor device including a horizontal HEMT (High Electron Mobility Transistor) that is one of GaN-HEMT devices.

Figure 1:
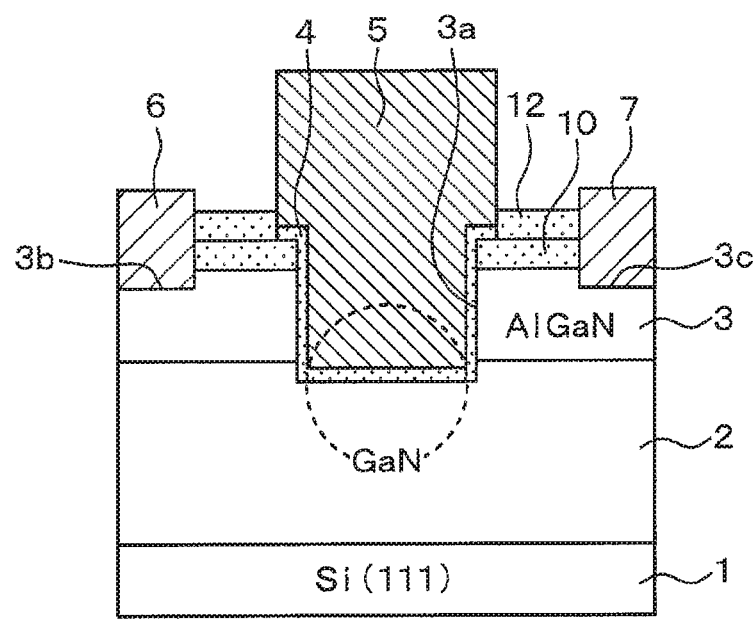
FIG. 1 is a sectional view showing a semiconductor device according to a first embodiment of the present disclosure.

As shown in FIG. 1, a semiconductor device according to the present embodiment includes a horizontal HEMT. This HEMT is configured as follows.

The horizontal HEMT is formed using, as a compound semiconductor substrate, a structure in which a GaN layer 2 and an n-type AlGaN layer 3 are laminated on the surface of a substrate 1. Two-dimensional electronic gas (hereinafter, 2DEG) carriers are induced to the GaN layer 2 side of a AlGaN/GaN interface formed by the GaN layer 2 and the AlGaN layer 3, by a piezoelectric effect and a polarization effect.

Si(111) is taken as an example of the substrate 1 in FIG. 1, but the substrate 1 is made up of a semi-insulating material or a semiconductor material such as Si(111), SiC, or sapphire, for example. On this substrate 1, the GaN layer 2 and the AlGaN layer 3 are formed by the heteroepitaxial growth, for example. A resistivity value of the compound semiconductor substrate may be adjusted arbitrarily by use of an impurity concentration in each layer constituting the compound semiconductor substrate, in accordance with characteristics of an aimed device. It is also possible to allow the GaN layer 2 to have favorable crystallinity by placing an AlGaN—GaN super-lattice layer or the like between the GaN layer 2 and the substrate 1. Note that the crystallinity here is a defect, dislocation, and the like in the GaN layer 2, which affects electrical and optical characteristics.

On the channel section in this compound semiconductor substrate, a recess-shaped section (concave section) 3a is formed so as to reach the GaN layer 2 from the surface of the AlGaN layer 3. Further, grooves 3b, 3c each having a predetermined depth from the surface of the AlGaN layer 3 are formed on the opposite sides of the compound semiconductor substrate with the sides sandwiching the recess-shaped section 3a.

The place where the recess-shaped section 3a is formed is provided with a gate structure configured of a gate insulating film 4 formed in and around the recess-shaped section 3a, and a gate electrode 5 formed on the gate insulating film 4. The gate insulating film 4 is made up of an aluminum oxide film ($Al_2O_3$) or the like, and the gate electrode 5 is made up of aluminum, Poly-Si doped with impurities, or the like. Although not shown, a gate-wiring layer made up of Al or the like is formed on the surface of the gate electrode 5. As for a material for each of the gate electrode and the gate insulating film, an optimum material and its structure may be selected in view of a threshold voltage, a gate withstand voltage, long-term reliability, and the like of the aimed device.

Meanwhile, on the surface of the AlGaN layer 3, a place where the groove 3b is disposed is formed with a source electrode 6 so as to get into the groove 3b, and a place where the groove 3c is disposed is formed with a drain electrode 7 so as to get into the groove 3c. The source electrode 6 and the drain electrode 7 are respectively in ohmic contact with the surfaces of the grooves 3b, 3c. The horizontal HEMT according to the present embodiment is configured as described above. A size of each section of the horizontal HEMT as thus configured is arbitrary, and for example, a distance between the source and the gate and a distance between the gate and the drain may be decided in view of on-resistance and a withstand voltage of the aimed device.

Further, in the present embodiment, in the horizontal HEMT as thus configured, the donor element (Si or O) concentration in the interface between the gate insulating film 4 and the GaN layer 2 and in the lattice position on the GaN layer 2 side (the surface layer section of the GaN layer 2) is set to equal to or less than $5.0 \times 10^{17}$ cm$^{-3}$. Preferably, the donor element concentration is set to equal to or less than $3.5 \times 10^{17}$ cm$^{-3}$. Since the donor element concentration in the interface between the gate insulating film 4 and the GaN layer 2 and in the lattice position on the GaN layer 2 side is set to a low concentration as thus described, a variation in threshold voltage due to the donors in the channel section can be suppressed. Especially when the donor element concentration in the lattice position is set to equal to or less than $3.5 \times 10^{17}$ cm$^{-3}$, the variation in threshold voltage can be suppressed more effectively. Hence it is possible to control the threshold voltage to a proper value, and thereby to allow the semiconductor device to have a structure capable of realizing a GaN device with small variations.

Specifically, the horizontal HEMT as thus configured applies a gate voltage to the gate electrode 5 to perform switching operation. That is, the horizontal HEMT performs operations of applying a gate voltage to the gate electrode 5 to control a density of an electronic layer (channel) generated in the interface between the GaN layer 2 and the gate insulating film 4 below the gate electrode 5, and applying a voltage between the source and the drain to allow a current to flow between the source and the drain.

In such a horizontal HEMT, an electron concentration and the like change in accordance with the donor element concentration in the lower part of the gate structure, to affect the threshold. Hence the donor element concentration is preferably low. In contrast, in the present embodiment, the donor element concentration in the interface between the gate insulating film 4 and the GaN layer 2 and in the lattice position on the GaN layer 2 side is set to the low value described above. For this reason, the variation in threshold voltage due to the donors in the channel section can be suppressed to control the threshold voltage to a proper value. Hence it is possible to allow the semiconductor device to have a structure capable of realizing a GaN device with small variations.

Subsequently, a method for producing the horizontal HEMT according to the present embodiment will be described with reference to FIG. 2.

Figure 2A:
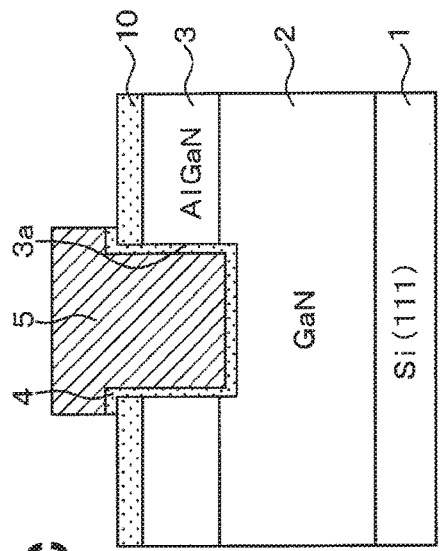
FIGS. 2A to 2D are sectional views showing a production process of the semiconductor device shown in FIG. 1.

[Step Shown in FIG. 2A]

A compound semiconductor substrate is prepared in which the GaN layer 2 and the n-type AlGaN layer 3 are laminated on the surface of the substrate 1 of Si(111), SiC, sapphire, or the like. For example, the GaN layer 2 and the AlGaN layer 3 are formed on the surface of the substrate 1 by MOCVD (Metal Organic Chemical Vapor Deposition), MBE (Molecular Beam Epitaxy) with ultrahigh purity and high accuracy, or some other method.

Figure 2B:
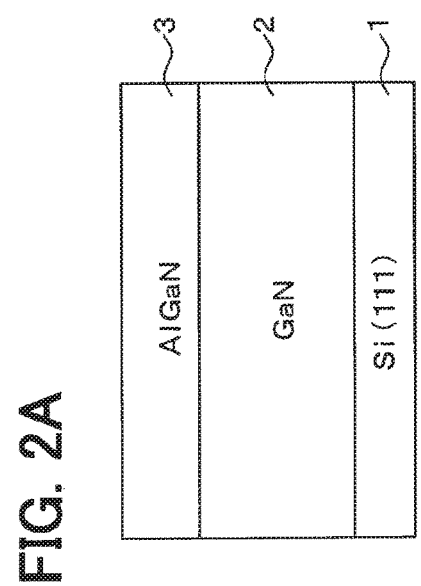

[Step Shown in FIG. 2B]

After an oxide film 10 to be an interlayer film is formed on the surface of the AlGaN layer 3, a resist 11 to be a second mask is formed on the surface of the oxide film 10. The resist 11 is patterned through a photolithography step, and the oxide film 10 is then patterned using this resist 11 as a mask. As a result, the resist 11 and the oxide film 10 are opened in a planned formation position for the gate structure on the surface of the AlGaN layer 3. Thereafter, a dry etching step by use of the resist 11 and the oxide film 10 as the mask is performed, to provide the recess on the surface of the AlGaN layer 3 and form the recess-shaped section 3a in which the surface of the GaN layer 2 is exposed. Further, after the formation of the recess-shaped section 3a, the resist 11 used as the mask for the dry etching is removed, to complete the dry etching step.

Figure 2C:
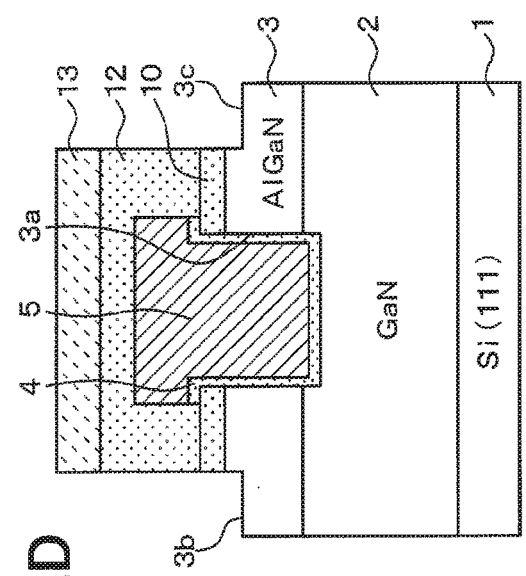

[Step Shown in FIG. 2C]

Subsequently, a step of forming the gate insulating film 4 is performed. However, before the performance of the step of forming the gate insulating film 4 after the exposure of the surface of the GaN layer 2 as described above, there is performed a step of removing donor elements present on the surface of the GaN layer 2 exposed from the recess-shaped section 3a.

For example, in the case of removing Si as the donor element, by performing annealing in an F-type gas such as $CF_4$, a $Cl_2$-type gas, an $H_2$ gas, or an HCl gas, the Si elements are adsorbed and then desorbed as a volatile gas. Accordingly, Si as the donor element can be removed.

For example, in the case of using an F-type gas such as $CHF_3$, $SF_6$ or $CF_4$, a chamber is made to have a depressed atmosphere of 1 to 50 Pa, while $CF_4$ is introduced into the chamber at a flow rate of about 0.1 to 100 sccm, to be heated to 500° C. or higher. At this time, a mixed gas of $CF_4$ with $H_2$ or $O_2$ may be used. In the case of using a $Cl_2$-type gas, the chamber is made to have a depressed atmosphere of 0.1 to 100 Pa, while $Cl_2$ is introduced into the chamber at about 5 to 100 sccm, to be heated to the chamber at 500° C. or higher. Further, the $H_2$ gas, the HCl gas, or a mixed gas containing those may be used. Adherent Si is combined with oxygen in the air and is partially in the state of SiOx. As the gas type to be used, a gas having a nature of etching Si and Si oxide, and a condition thereof, may be used. Further, when removing Si and SiOx just by heating is difficult, a plasma source may be used to employ an active radical gas.

Further, in the case of removing O as the donor element, it is effective to redox the O element by use of an oxygen trapping effect by Al. For example, a thin film of Al or AlOx (x<1.5) with a thickness of 5 nm or smaller is formed on the GaN surface and heated to 400° C. or higher, to react O on the GaN surface with Al or AlOx. It is then annealed in an $O_2$ atmosphere, to be converted to $Al_2O_3$. In this manner, all O on the surface can be adsorbed to $Al_2O_3$. The Al—O bond energy is more stable than the Ga—O bond energy, and O once taken into $Al_2O_3$ is not dispersed in GaN.

Further, when Si or O on the surface is in the state of SiOx or GaOx, exposing SiOx or GaOx to a radical gas made up of a plasma of $H_2$, $NF_3$ (or HF) and $NH_3$ enables the removal by etching without damage on the surface of the GaN substrate. It is also effective to heat the substrate at this time so as to promote the reaction.

Then, the step of forming the gate insulating film 4 is performed after the step of removing the donor elements, while a step of exposure into the atmosphere containing Si or O is not performed, or it is performed for a short period of time, between those steps. For example, while the step of removing the donor elements and the step of forming the gate insulating film 4 are performed in the same chamber, these steps are made to be a vacuum consistent step without exposure to the air, thereby enabling avoidance of the step of exposure into the atmosphere containing Si or O. Further, the carriage from the chamber used in the step of removing the donor elements to the chamber used in the step of forming the gate insulating film 4 may be performed in an $N_2$ or Ar atmosphere, or may be performed in vacuum.

Then, an insulating film of $Al_2O_3$ or the like and a film of a metal material, such as Poly-Si doped with impurities or Al, are sequentially formed on the surface of the AlGaN layer 3, including the inside of the recess-shaped section 3a. Then, these films are patterned using a mask, not shown. Accordingly, the gate insulating film 4 and the gate electrode 5 are formed.

Figure 3:
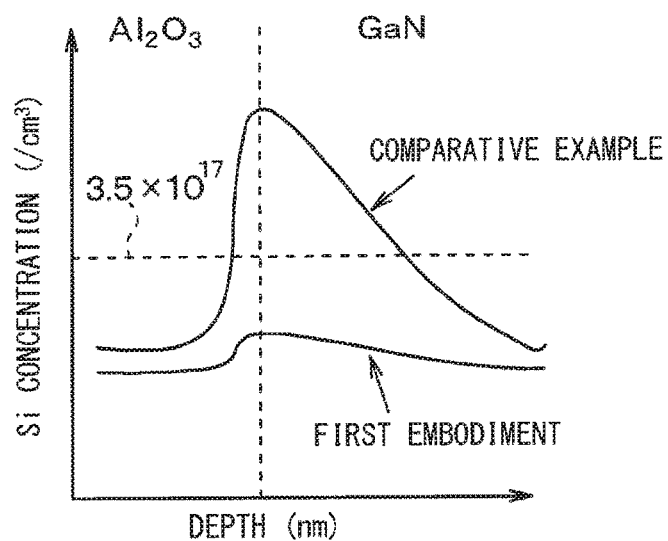
FIG. 3 is a diagram showing a result of studying an Si concentration with respect to a substrate depth direction in the vicinity of an interface between a gate insulating film 4 and a GaN layer 2.

At this time, since the gate insulating film 4 is formed after the step of removing the donor elements has been performed, the donor element concentration in the interface between the gate insulating film 4 and the GaN layer 2 and in the lattice position on the GaN layer 2 side is equal to or less than $5.0 \times 10^{17}$ cm$^{-3}$, and preferably equal to or less than $3.5 \times 10^{17}$ cm$^{-3}$. FIG. 3 shows a result of studying the Si concentration with respect to a substrate depth direction in the vicinity of the interface between the gate insulating film 4 and the GaN layer 2 (broken line portion in FIG. 1). As shown in this diagram, it is found that, when the step of removing the donor elements as in the present embodiment is performed, the donor concentration in the interface between the gate insulating film 4 and the GaN layer 2 and in the lattice position on the GaN layer 2 side has been small. Specifically, the concentration has been equal to or less than $3.5 \times 10^{17}$ cm$^{-3}$. In contrast, when the step of removing the donor elements is not performed as a comparative example (Comparative Example), the donor concentration has been high each in the interface between the gate insulating film 4 and the GaN layer 2 and in the lattice position on the GaN layer 2 side. Specifically, the concentration has exceeded $5.0 \times 10^{17}$ cm$^{-3}$.

Figure 4:
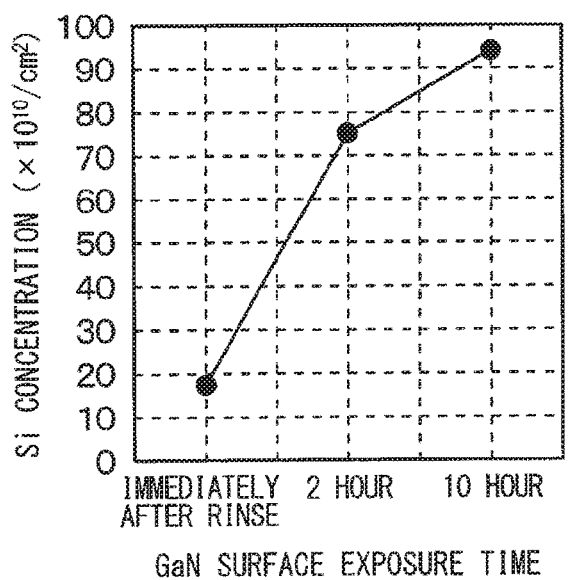
FIG. 4 is a diagram showing a result of studying elapsed time and a change in Si concentration when the surface of the GaN layer 2 is exposed to the air after the surface rinse is performed by performing the step of removing the donor elements.

This is because, after the step of removing the donor elements has been performed, the gate insulating film 4 is formed without performing the step of exposure to the atmosphere containing Si, O, or the like, such as the air. FIG. 4 is a diagram showing a result of studying elapsed time and a change in Si concentration when the surface of the GaN layer 2 is exposed to the air after the surface rinse is performed by performing the step of removing the donor elements. As shown in FIG. 4, the Si concentration becomes higher with increase in time for exposure to the air, and for example, the Si concentration exceeds $5.0 \times 10^{17}$ cm$^{-3}$ which can affect the threshold voltage, in about an hour. Thus, in order to make the Si concentration equal to or less than $5.0 \times 10^{17}$ cm$^{-3}$, the step of forming the gate insulating film 4 may be performed within an hour after the step of removing the donor elements has been performed, or the step of forming the gate insulating film 4 may be performed while the step of exposure into the atmosphere containing Si or O is not performed. Although not shown, a result of the O concentration is similar to that of the Si concentration.

Therefore, as in the present embodiment, the donor element concentration can be set to a low concentration as described above by performing the step of forming the gate insulating film 4 after the step of removing the donor elements while the step of exposure into the atmosphere containing Si or O is not performed, or it is performed for a short period of time.

As thus described, by setting the donor element concentration in the interface between the gate insulating film 4 and the GaN layer 2 and in the lattice position on the GaN layer 2 side to a low concentration, a variation in threshold voltage due to the donors in the channel section can be suppressed. Hence, as compared with such a conventional case of not performing the step of removing the donor elements, it is possible to control the threshold voltage to a proper value, and thereby to allow the semiconductor device to have a structure capable of realizing a GaN device with small variations.

When silicon (111) is used as the substrate 1, Si may be released from the substrate surface to the outside. Thus, in the case of using silicon (111) as the substrate 1, after the GaN layer 2 has been formed on the substrate 1, a portion other than the surface of the GaN layer 2 is preferably covered with a mask to control the release of Si to the outside. Hence it is possible to hold the donor element concentration lower, and thereby to make easier the control of the threshold voltage to a proper value.

Figure 2D:
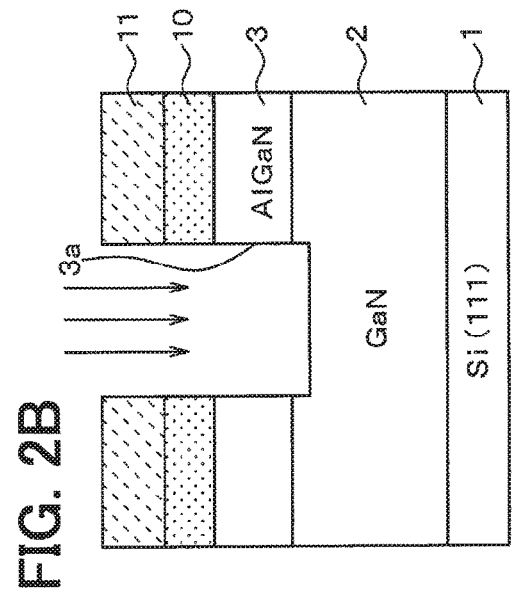

[Step shown in FIG. 2D]

There is formed an insulating film and a mask that open the planned formation region for the grooves 3b, 3c while covering the gate insulating film 4 and the gate electrode 5. For example, the insulating film can be configured by forming an oxide film 12, and then forming a resist 13 to be the mask on the surface of the oxide film 12.

Subsequently, a dry etching step for the oxide film 12 and the AlGaN layer 3 is performed using the resist 13, to form the grooves 3b, 3c on the surface of the AlGaN layer 3. Thereafter, the resist 13 is removed.

Steps thereafter are similar to conventional ones, and an inter-layer insulating film forming step, a contact hole forming step, a step of forming the source electrode 6 and the drain electrode 7, and some other step are performed, to complete the semiconductor device having the horizontal HEMT shown in FIG. 1.

Second Embodiment

A second embodiment of the present disclosure will be described. The present embodiment is different from the first embodiment in the donor element concentration in the compound semiconductor substrate, but the second embodiment is same as the first embodiment in the other respects. Hence, only the different respect from the first embodiment will be described.

In a semiconductor device having a horizontal HEMT in the present embodiment, the donor element (Si or O) concentration in the interface between the gate insulating film 4 and the GaN layer 2 is equal to or more than $5.0\times10^{17}$ cm$^{-3}$. However, the donor element concentration in the lattice position on the GaN layer 2 side (the surface layer section of the GaN layer 2) of the interface is set to equal to or less than $5.0\times10^{17}$ cm$^{-3}$, and preferably equal to or less than $3.5\times10^{17}$ cm$^{-3}$. In such a manner, even when the donor element concentration in the interface between the gate insulating film 4 and the GaN layer 2 is set to a high concentration, when the donor element concentration in the lattice position on the GaN layer 2 side of the interface is set low, a similar effect to that of the first embodiment can be obtained.

The semiconductor device having the horizontal HEMT with such a configuration is basically produced by a similar producing process as in the first embodiment. However, a step of lowering the donor element in the lattice position in the GaN layer 2 is performed in place of the step of removing the donor elements.

For example, by performing annealing in an oxidizing atmosphere, namely an atmosphere that oxidizing GaN, such as $O_2$ or $H_2O$, there is formed an $SiO_2$ stable layer made up of $SiO_2$ that is more stable than Si in GaN. Since the bond between Si and O is stronger than the bond between Si and N, having formed $SiO_2$ enables Si to be inactivated so as to be prevented from being dispersed and becoming a donor element that takes up the lattice position in the GaN layer 2. Hence the donor element concentration in the interface between the gate insulating film 4 and the GaN layer 2 and the lattice position on the GaN layer 2 side can be set low.

Note that the annealing in the oxidizing atmosphere for lowering the donor element concentration in the lattice position on the GaN layer 2 side of the interface between the gate insulating film 4 and the GaN layer 2 may be performed after the formation of the gate insulating film 4. Even when the annealing is performed after the formation of the gate insulating film 4, Si surrounded by the lattice position of the GaN layer 2 is oxidized and becomes $SiO_2$, and hence Si is inactivated without acting as the donor element present in the lattice position. Hence it is possible to suppress the variation in threshold voltage. Further, when such annealing in the oxidizing atmosphere is performed, at the time of performing another annealing in a post step, it needs to be performed at a temperature and a thermal budge equal to or lower than those at which the Si stable layer formed by the annealing in the oxidizing atmosphere is not peeled.

Other Embodiments

Although the step of inactivating the donor elements has been described in the above second embodiment, in order to prevent activation of the donor elements, for example, a thermal budget (an integrated value of accumulated heated temperatures) after the step of forming the GaN layer 2 may be limited to a temperature equal to or lower than a temperature at which the donor elements are activated.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. A method for producing a semiconductor comprising a GaN device including:
   a substrate made of a semi-insulating material or a semi-conductor;
   a channel forming layer including a GaN layer arranged on the substrate;
   a gate structure having a gate insulating film in contact with the GaN layer and arranged on the channel forming layer, and a gate electrode arranged via the gate insulating film; and
   a source electrode and a drain electrode that are arranged on opposite sides to interpose the gate structure, on the channel forming layer, the method comprising:
   forming the channel forming layer that includes the GaN layer on the substrate;
   forming the gate insulating film that is in contact with the GaN layer on the channel forming layer; and
   removing donor elements present in a portion of the GaN layer that is in contact with the gate insulating film after forming the channel forming layer and before forming the gate insulating film,
   wherein the gate insulating film is formed without being exposed to an atmosphere containing the donor elements after removing the donor elements.

2. The method for producing the semiconductor device according to claim 1, further comprising:
   forming a mask that opens a planned formation position for the gate structure on the channel forming layer, to form a recess-shaped section, in which the GaN layer is exposed by etching using the mask,
   wherein the donor elements are removed after forming the recess-shaped section.

3. The method for producing the semiconductor device according to claim 1,
   wherein an annealing process is carried out in removing the donor elements by using any of an F-type gas, a $Cl_2$-type gas, an $H_2$ gas, and an HCl gas.

* * * * *